United States Patent
Huang et al.

(10) Patent No.: US 11,942,906 B2
(45) Date of Patent: Mar. 26, 2024

(54) TRANSMITTER HAVING HARMONIC IMPEDANCE ADJUSTMENT CIRCUIT

(71) Applicant: Realtek Semiconductor Corp., HsinChu (TW)

(72) Inventors: Ting-Yao Huang, HsinChu (TW); Teng-Yuan Chang, HsinChu (TW); Po-Chih Wang, HsinChu (TW); Ka-Un Chan, HsinChu (TW)

(73) Assignee: Realtek Semiconductor Corp., HsinChu (TW)

( * ) Notice: Subject to any disclaimer, the term of this patent is extended or adjusted under 35 U.S.C. 154(b) by 117 days.

(21) Appl. No.: 17/666,530

(22) Filed: Feb. 7, 2022

(65) Prior Publication Data
US 2022/0286096 A1 Sep. 8, 2022

(30) Foreign Application Priority Data
Mar. 5, 2021 (TW) .................... 110107940

(51) Int. Cl.
*H04L 27/00* (2006.01)
*H03F 1/56* (2006.01)
*H03F 3/19* (2006.01)

(52) U.S. Cl.
CPC .......... *H03F 1/56* (2013.01); *H03F 3/19* (2013.01); *H03F 2200/222* (2013.01); *H03F 2200/387* (2013.01)

(58) Field of Classification Search
CPC .. H03D 2200/0086; H03D 7/166; H03D 7/14; H04B 1/30; H04B 15/04; H03B 2200/007; H03B 2200/0078; H04L 5/143; H04L 27/12; G01S 13/0209; G01S 7/35

USPC ........................................................ 375/295
See application file for complete search history.

(56) References Cited

U.S. PATENT DOCUMENTS

| 7,986,926 | B2 | 7/2011 | Rafi |
| 2003/0199259 | A1 | 10/2003 | Macedo |
| 2004/0257478 | A1* | 12/2004 | Su .................... H03D 7/165 348/731 |

(Continued)

FOREIGN PATENT DOCUMENTS

CN 101517905 A 8/2009

OTHER PUBLICATIONS

Office action dated Jun. 28, 2023 for CN application No. 202110267982.0, filing date: Mar. 12, 2021, pp. 1-4., dated Jun. 28, 2023.

*Primary Examiner* — Khai Tran
(74) *Attorney, Agent, or Firm* — Winston Hsu

(57) ABSTRACT

The present invention provides a transmitter including a mixer, a harmonic impedance adjustment circuit and an amplifier. The mixer is configured to mix a first baseband signal with a first oscillation signal to generate a first mixed signal to a first node, and to mix a second baseband signal with a second oscillation signal to generate a second mixed signal to a second node. The harmonic impedance adjustment circuit is coupled between the first node and the second node, and is configured to reduce harmonic components of the first mixed signal and the second mixed signal to generate an adjusted first mixed signal and an adjusted second mixed signal. The amplifier is coupled to the harmonic impedance adjustment circuit, and is configured to generate an amplified signal according to the adjusted first mixed signal and the adjusted second mixed signal.

13 Claims, 5 Drawing Sheets

(56) References Cited

U.S. PATENT DOCUMENTS

| | | | |
|---|---|---|---|
| 2005/0239430 A1* | 10/2005 | Shah | H03D 7/1483 |
| | | | 455/302 |
| 2019/0089314 A1* | 3/2019 | Sun | H03F 3/245 |
| 2021/0111678 A1* | 4/2021 | Yim | H03F 3/24 |
| 2021/0203331 A1* | 7/2021 | Finocchiaro | H03L 7/23 |

* cited by examiner

TRANSMITTER HAVING HARMONIC IMPEDANCE ADJUSTMENT CIRCUIT

BACKGROUND OF THE INVENTION

1. Field of the Invention

The present invention relates to a transmitter.

2. Description of the Prior Art

FIG. 1 is a diagram of a conventional transmitter 100 with a quadrature modulation architecture. As shown in FIG. 1, the transmitter 100 comprises two mixers 110, 120 and a combining circuit 130. In the operation of the transmitter, the mixer 110 is configured to mix a baseband signal BB_I with an oscillation signal LO_I, the mixer 120 is configured to mix a baseband signal BB_Q with an oscillation signal LO_Q, and the combining circuit 130 combines the output signals of the mixers 110 and 120 to generate an output signal Vout. Then the output signal Vout is transmitted to a back-end circuit for processing and then transmitted by an antenna. In the transmitter 100, the baseband signal BB_I can be expressed as $\cos(\omega_{BB}t)$, the baseband signal BB_Q can be expressed as $\sin(\omega_{BB}t)$, the oscillation signal LO_I can be ex pressed as $\cos(\omega_{LO}t)$, and the oscillation signal LO_Q can be expressed as $\sin(\omega_{LO}t)$, so the output signal Vout can be expressed by the following formula:

$$Vout = \cos(\omega_{LO}t) * \cos(\omega_{BB}t) + \sin(\omega_{LO}t) * \sin(\omega_{BB}t) =$$
$$\frac{1}{2}\cos(\omega_{LO}t - \omega_{BB}t) + \frac{1}{2}\cos(\omega_{LO}t + \omega_{BB}t) +$$
$$\frac{1}{2}\cos(\omega_{LO}t - \omega_{BB}t) - \frac{1}{2}\cos(\omega_{LO}t + \omega_{BB}t) = \cos(\omega_{LO}t - \omega_{BB}t);$$

wherein the single-frequency output signal $\cos(\omega_{LO}t-\omega_{BB}t)$ in the above formula is the signal sent by the transmitter 100 ideally, and the eliminated signal $\cos(\omega_{LO}t+\omega_{BB}t)$ in the above is called image signal.

However, the above formula only shows an ideal situation, and there will be non-ideal factors in the actual circuit, so that the image signal cannot be completely eliminated. For example, the non-ideal factors may include a DC offset of the baseband signal, a gain offset or a phase offset between two paths of the mixers 110 and 120, or a gain offset or a phase offset between two oscillation signals . . . etc.

In addition, with the improvement of the wireless transmission rate of electronic products, the requirements for signal quality and error vector magnitude (EVM) are getting higher and higher. Therefore, it is necessary to further suppress the image signal to meet the stringent signal quality requirements.

SUMMARY OF THE INVENTION

It is therefore an objective of the present invention to provide a transmitter, which can effectively suppress the image signal, to solve the above-mentioned problems.

According to one embodiment of the present invention, a transmitter comprising a mixer, a harmonic impedance adjustment circuit and an amplifier is disclosed. The mixer is configured to mix a first baseband signal with a first oscillation signal to generate a first mixed signal to a first node, and to mix a second baseband signal with a second oscillation signal to generate a second mixed signal to a second node. The harmonic impedance adjustment circuit is coupled/embedded between the first node and the second node, and is configured to reduce harmonic components of the first mixed signal and the second mixed signal to generate an adjusted first mixed signal and an adjusted second mixed signal. The amplifier is coupled/embedded to the harmonic impedance adjustment circuit, and is configured to generate an amplified signal according to the adjusted first mixed signal and the adjusted second mixed signal.

These and other objectives of the present invention will no doubt become obvious to those of ordinary skill in the art after reading the following detailed description of the preferred embodiment that is illustrated in the various figures and drawings.

DETAILED DESCRIPTION

Figure 2:
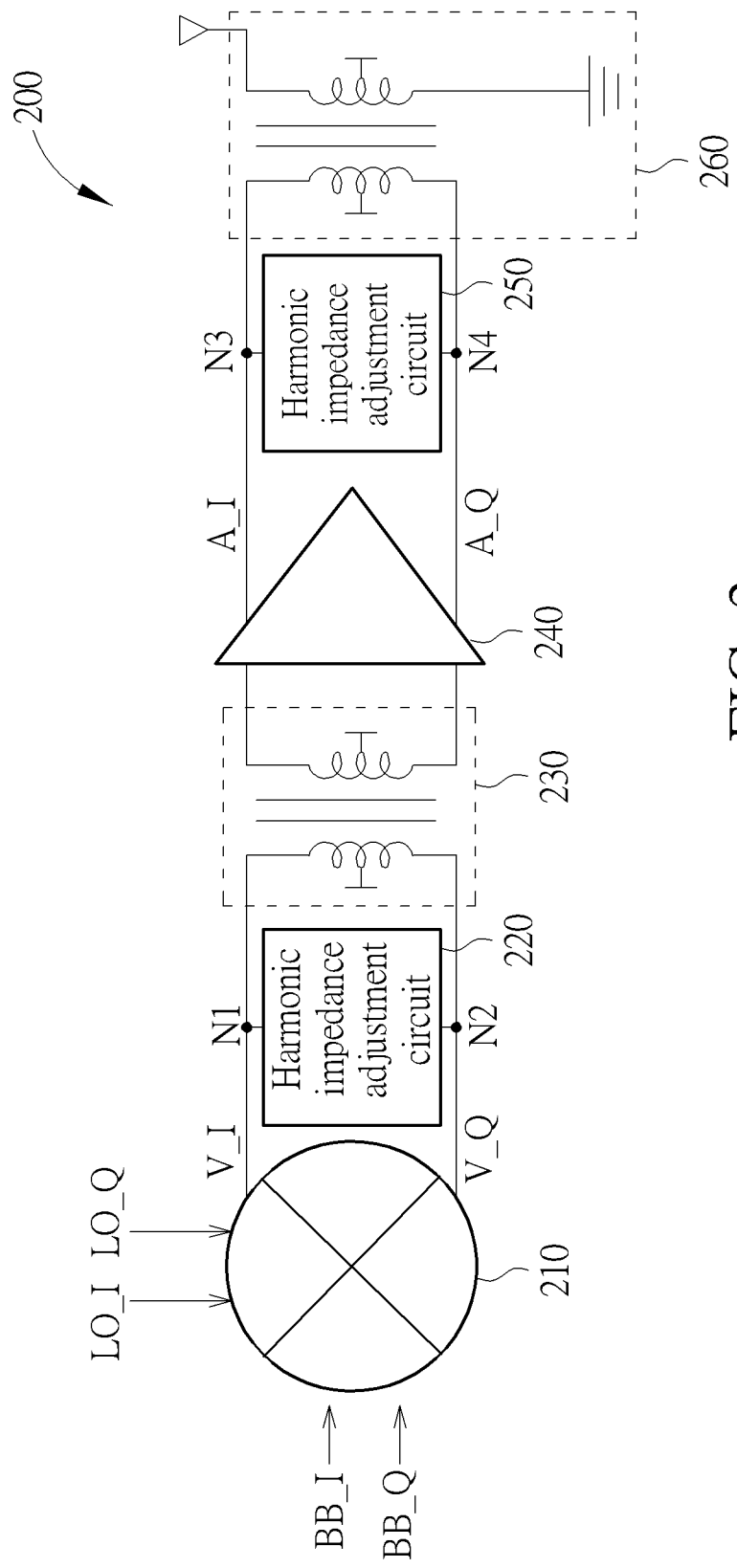
FIG. 2 is a diagram illustrating a transmitter according to one embodiment of the present invention.

FIG. 2 is a transmitter 200 according to one embodiment of the present invention. As shown in FIG. 2, the transmitter 200 comprises a mixer 210, a harmonic impedance adjustment circuit 220, a transformer 230, an amplifier 240, a harmonic impedance adjustment circuit 250 and a transformer 260.

The transmitter 200 of this embodiment can be applied to any electronic device that requires wireless communication, that is, the transmitter 200 receives baseband signals BB_I and BB_Q and generates corresponding output signals to an antenna for transmission.

Figure 1:
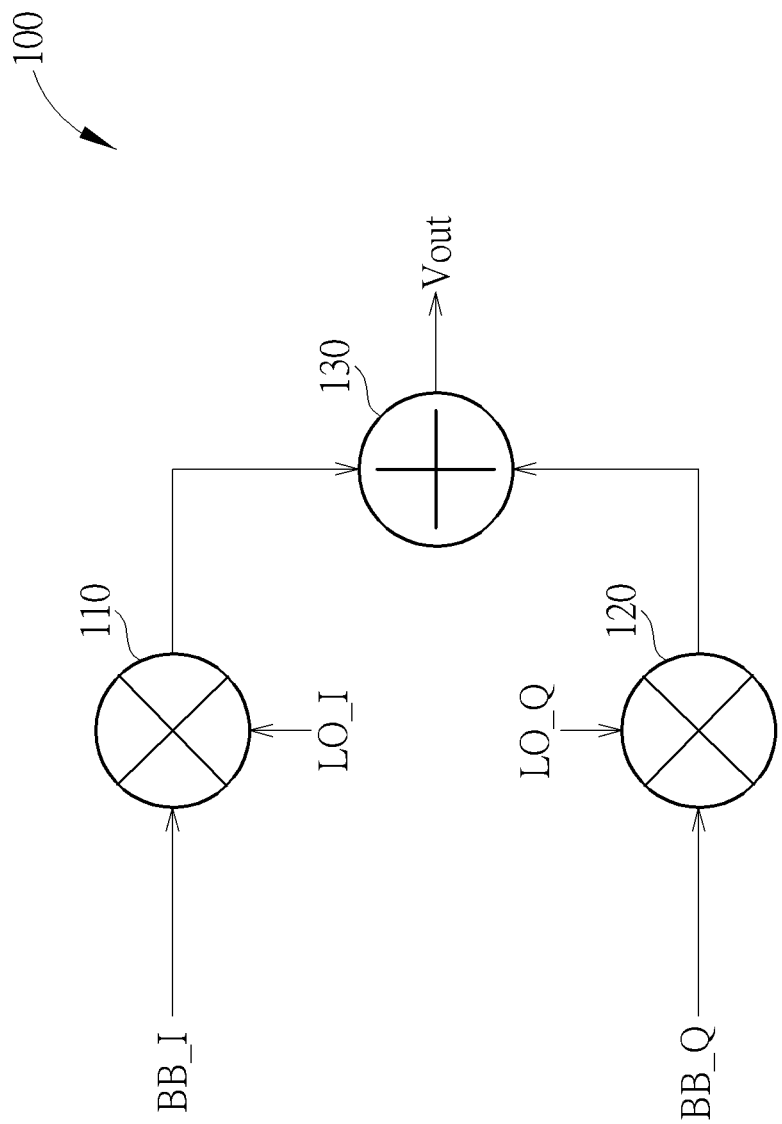
FIG. 1 is a diagram of a conventional transmitter with a quadrature modulation architecture.

In a basic operation of the transmitter 200, the mixer 210 mix the baseband signals BB_I and BB_Q with oscillation signals LO_I and LO_Q to generate mixed signals V_I and V_Q, respectively, wherein the mixed signals V_I and V_Q are used as a differential signal. Specifically, the mixer 210 can be implemented by using two mixers 110 and 120 shown in FIG. 1, that is the mixer 210 mixes the baseband signal BB_I with the oscillation signal LO_I to generate the mixed signal V_I, and the mixer 220 further mixes the baseband signal BB_Q with the oscillation signal LO_Q to generate the mixed signal V_Q.

Description of the prior art mentions that the image signal of the transmitter 200 cannot be completely eliminated due to non-ideal factors. However, in addition to the three non-ideal factors mentioned in the prior art, components behind the mixer 210 may also cause harmonic mixing and affect the effect of image suppression. Specifically, due to the non-ideal factors of the mixer 210, and the oscillation signals LO_I and LO_Q may contain high-order frequency components due to non-ideal factors, the mixed signals V_I and V_Q will cause the generation of image signals due to the harmonic mixing in the subsequent components. Four examples are given as follows: (1) assuming that the mixed signals V_I and V_Q have harmonic components of $(3*f_{LO}+f_{BB})$ and $(2*f_{LO})$, respectively, the harmonic mixing caused by the subsequent amplifier will make the subsequent signal has an image signal with a frequency of $(f_{LO}+f_{BB})$. (2) assuming that the mixed signals V_I and V_Q have harmonic components of $(4*f_{LO})$ and $(3*f_{LO}-f_{BB})$ respectively, the harmonic mixing caused by the subsequent amplifier will make the subsequent signal has an image signal with a frequency of $(f_{LO}+f_{BB})$. (3) assuming that the mixed signals V_I and V_Q have harmonic components of $(2*f_{LO}-2*f_{BB})$ and $(f_{LO}-3*f_{BB})$ respectively, the harmonic mixing caused by the subsequent amplifier will make the subsequent signal has an image signal with a frequency of $(f_{LO}+f_{BB})$. (4) assuming that the mixed signals V_I and V_Q have harmonic components of $(2*f_{LO})$ and $(f_{LO}-f_{BB})$ respectively, the harmonic mixing caused by the subsequent amplifier will make the subsequent signal has an image signal with a frequency of $(f_{LO}+f_{BB})$. The above-mentioned '$f_{LO}$' is a frequency of the oscillation signals LO_I and LO_Q, and '$f_{BB}$' is a frequency of the baseband signals BB_I and BB_Q.

Therefore, in order to solve the above-mentioned harmonic mixing problem, this embodiment provides the harmonic impedance adjustment circuit 220 between the two output nodes N1 and N2 of the mixer 210 to reduce part of the harmonic components of the mixed signals of V_I and V_Q. For example, the harmonic impedance adjustment circuit 220 can reduce the strength of the harmonic components corresponding to $2*f_{LO}$, $3*f_{LO}$ and/or $4*f_{LO}$ in the mixed signals V_I and V_Q, so as to reduce the strength of the image signal generated due to the harmonic mixing.

After the harmonic impedance adjustment circuit 220 reduces the strength of the harmonic components of the mixed signals V_I and V_Q to generate adjusted mixed signals, the transformer 230 and the amplifier 240 process the adjusted mixed signals to generate amplified signals A_I and A_Q. Then, by designing the harmonic impedance adjustment circuit 250 between two output nodes N3 and N4 of the amplifier 240 to reduce the strength of the harmonic components corresponding to $2*f_{LO}$, $3*f_{LO}$ and/or $4*f_{LO}$ of the amplified signals A_I and A_Q, the strength of the image signal generated due to the harmonic mixing can be further reduced.

Finally, the amplified signals A_I and A_Q are processed by the transformer 260 and then transmitted to the antenna for transmission to other electronic devices.

Figure 3:
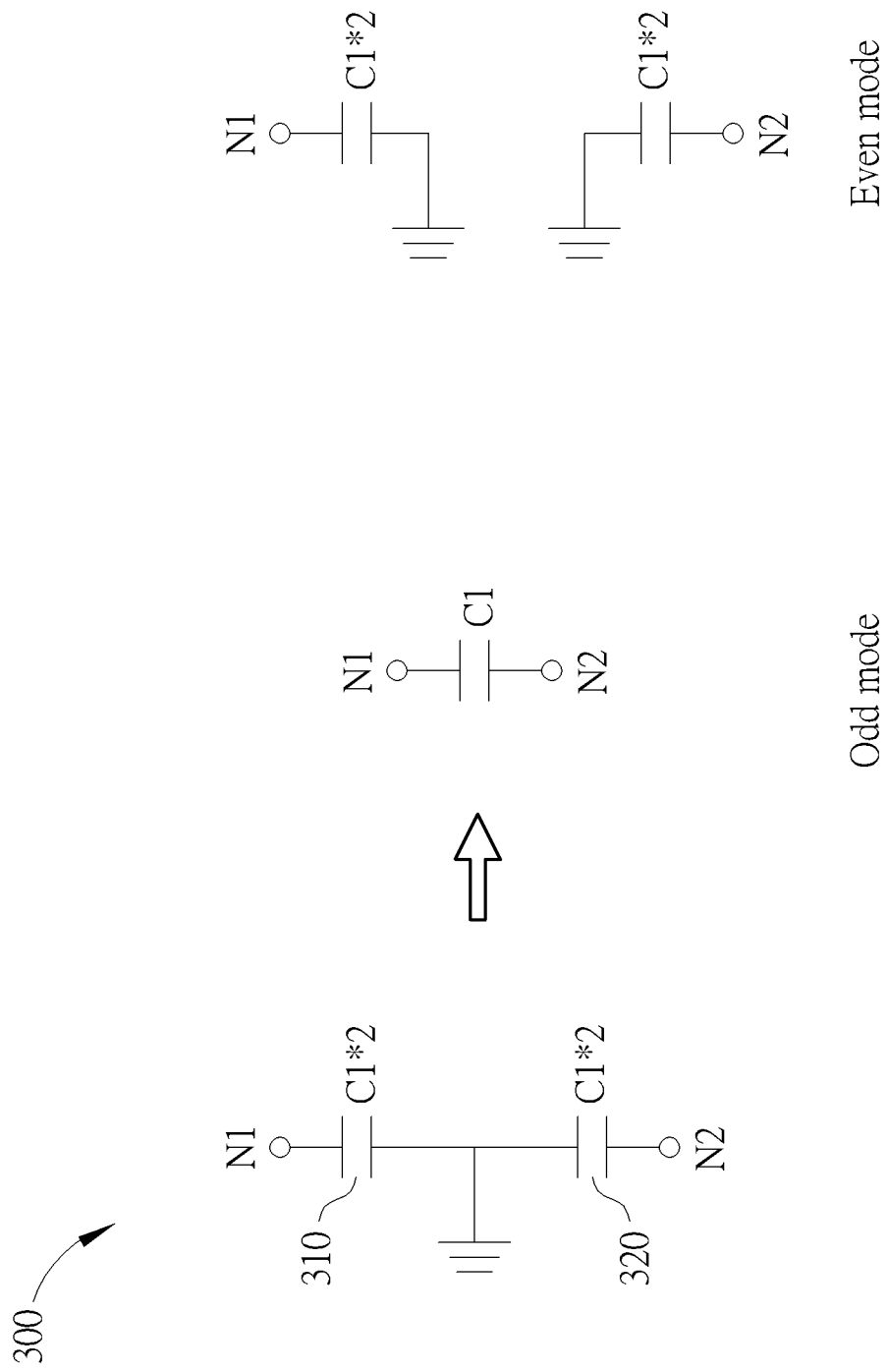
FIG. 3 is a diagram illustrating a harmonic impedance adjustment circuit according to one embodiment of the present invention.

FIG. 3 is a diagram illustrating a harmonic impedance adjustment circuit 300 according to one embodiment of the present invention, wherein the harmonic impedance adjustment circuit 300 can be used to implement the harmonic impedance adjustment circuit 220 and/or harmonic impedance adjustment circuit 250 shown in FIG. 2. For the convenience of description, the following embodiments use the harmonic impedance adjustment circuit 300 as the harmonic impedance adjustment circuit 220 for description. As shown in FIG. 3, the harmonic impedance adjustment circuit 300 comprises two capacitors C1 and C2, wherein the capacitor 310 is coupled/embedded between the node N1 and a ground voltage, and the capacitor C2 is coupled/embedded between the node N2 and the ground voltage. In this embodiment, the harmonic impedance adjustment circuit 300 comprises an odd mode and an even mode, wherein the odd mode corresponds to the main components (differential signals) of the mixed signals V_I and V_Q, and a transmission path of the main components of the mixed signals V_I and V_Q in the odd mode can be called a differential path; and the even mode corresponds to the even-order harmonic components of the mixed signals V_I and V_Q, and a transmission path of the even-order harmonic components of the mixed signals V_I and V_Q can be called a common-mode path. Specifically, assuming that the capacitance of the capacitors 310 and 320 are both 2*C1, for the main components (differential signals) of the mixed signals V_I and V_Q in the odd mode, the harmonic impedance adjustment circuit 300 can be regarded as a capacitor with the capacitance C1 coupled/embedded between the nodes N1 and N2; and for the harmonic components of each of the mixed signals V_I and V_Q in the even mode, the harmonic impedance adjustment circuit 300 can be regarded a capacitor with the capacitance 2*C1 coupled/embedded to the ground voltage. Therefore, by using the harmonic impedance adjustment circuit 300, the impedance on the common-mode path can be greatly reduced, so as to effectively reduce the strength of the harmonic components corresponding to $2*f_{LO}$ and $4*f_{LO}$ in the mixed signals V_I and V_Q.

Figure 4:
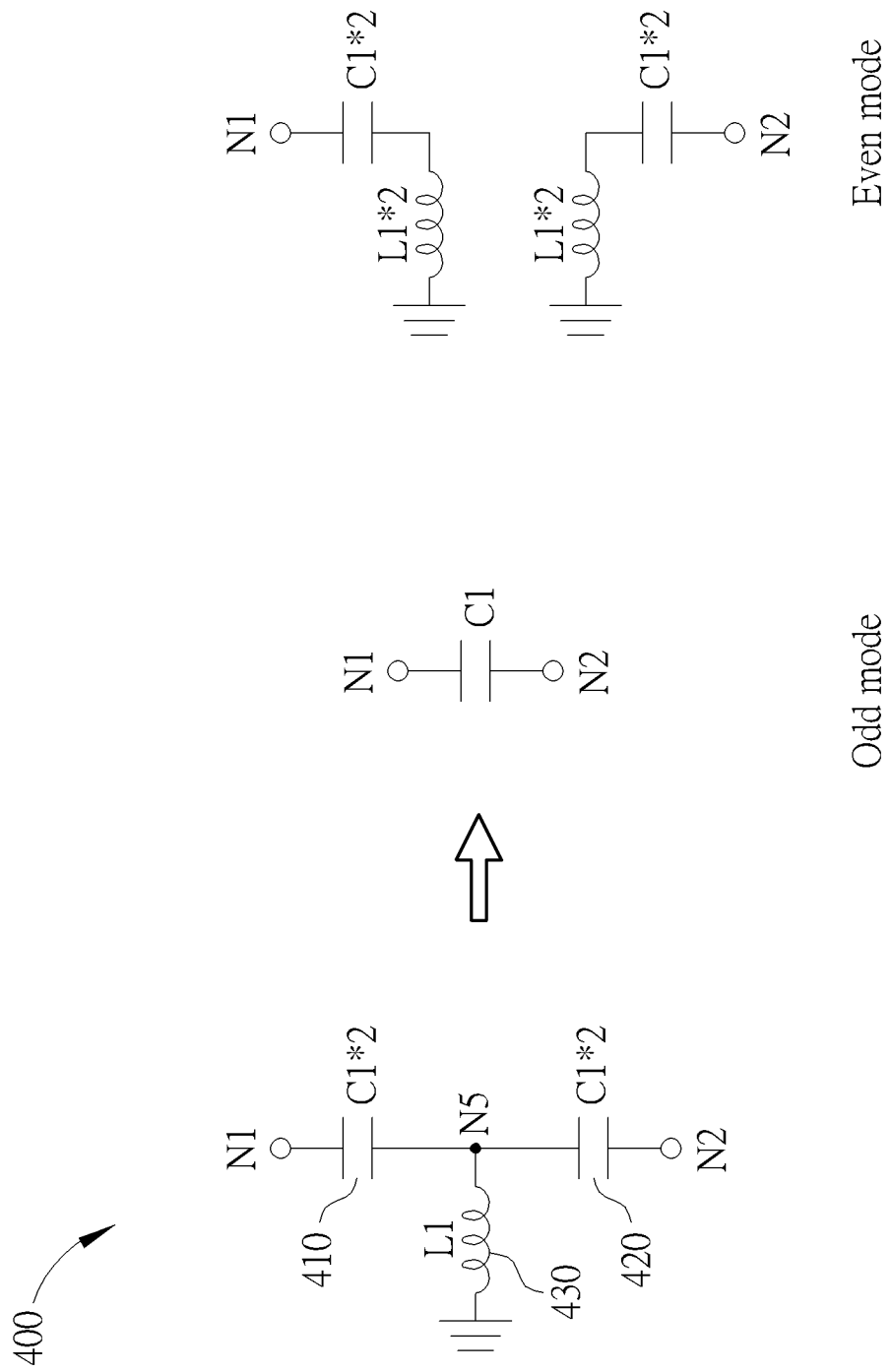
FIG. 4 is a diagram illustrating a harmonic impedance adjustment circuit according to another embodiment of the present invention.

FIG. 4 is a diagram illustrating a harmonic impedance adjustment circuit 400 according to another embodiment of the present invention, wherein the harmonic impedance adjustment circuit 400 can be used to implement the harmonic impedance adjustment circuit 220 and/or harmonic impedance adjustment circuit 250 shown in FIG. 2. For the convenience of description, the following embodiments use the harmonic impedance adjustment circuit 400 as the harmonic impedance adjustment circuit 220 for description. As shown in FIG. 4, the harmonic impedance adjustment circuit 400 comprises two capacitors 410, 420 and an inductor 430, wherein the capacitor 410 is coupled/embedded to the node N1 and a node N5, the capacitor 420 is coupled/embedded between the node N2 and the node N5, and the inductor 430 is coupled/embedded between the node N5 and the ground voltage. In this embodiment, the harmonic impedance adjustment circuit 400 comprises an odd mode and an even mode, wherein the odd mode corresponds to the main components (differential signals) of the mixed signals V_I and V_Q, and a transmission path of the main components of the mixed signals V_I and V_Q in the odd mode can be called a differential path; and the even mode corresponds to the even-order harmonic components of the mixed signals V_I and V_Q, and a transmission path of the even-order harmonic components of the mixed signals V_I and V_Q can be called a common-mode path. Specifically, assuming that the capacitance of the capacitors 410 and 420 are both 2*C1, and the inductor 430 has the inductance L1, for the main components (differential signals) of the mixed signals V_I and V_Q in the odd mode, the harmonic impedance adjustment circuit 400 can be regarded as a capacitor with the capacitance C1 coupled/embedded between the nodes N1 and N2; and for the harmonic components of each of the mixed signals V_I and V_Q in the even mode, the harmonic impedance adjustment circuit 400 can be regarded as a capacitor with the capacitance 2*C1 and an inductor with the inductance 2*L1 connected in series. In this embodiment, since the capacitance of the capacitors 410 and 420 involve the main components of the mixed signals V_I and V_Q and are not suitable for arbitrary changes, the designer can mainly design the inductance L1 of the inductor 430 to make the impedance corresponding to its oscillation frequency is greatly reduced, so as to achieve the purpose of reducing specific harmonic components. Specifically, assuming that the designer knows that the harmonic components with frequency $(2*f_{LO}2*f_{BB})$ will affect the image rejection effect, the inductance L1 of the inductor 430 can be designed to reduce harmonic component with frequency $(2*f_{LO}-2*f_{BB})$, that is $$2*f_{LO} - 2*f_{BB} = \frac{1}{2\pi\sqrt{L1*C1}}.$$

In practice, since '$f_{BB}$' is much smaller than '$f_{LO}$', the harmonic impedance adjustment circuit 400 can be regarded as reducing the harmonic components of the frequency of the oscillation signals LO_I and LO_Q by two, three or four times.

Figure 5:
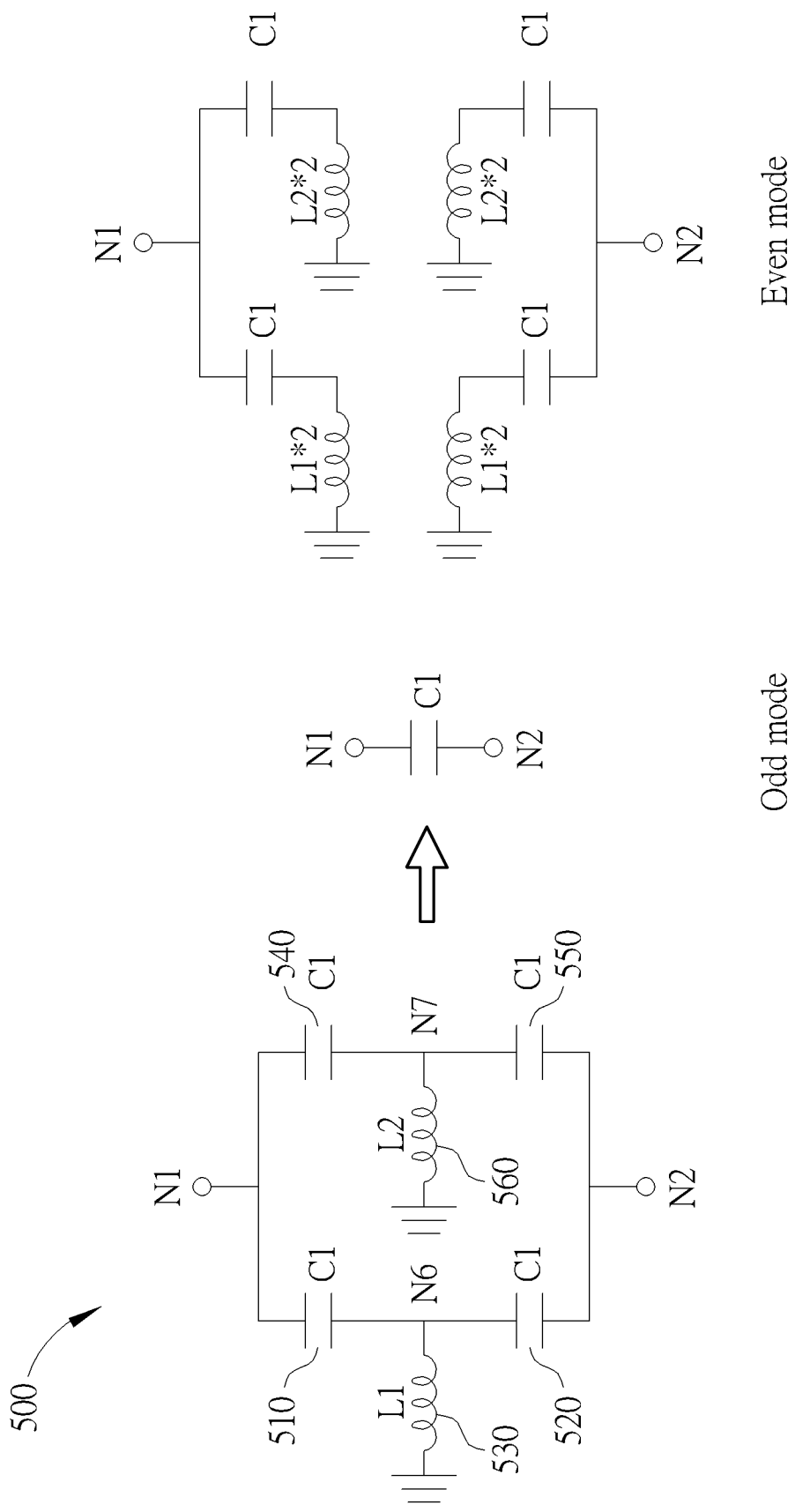
FIG. 5 is a diagram illustrating a harmonic impedance adjustment circuit according to another embodiment of the present invention.

FIG. 5 is a diagram illustrating a harmonic impedance adjustment circuit 500 according to another embodiment of the present invention, wherein the harmonic impedance adjustment circuit 500 can be used to implement the harmonic impedance adjustment circuit 220 and/or harmonic impedance adjustment circuit 250 shown in FIG. 2. For the convenience of description, the following embodiments use the harmonic impedance adjustment circuit 500 as the harmonic impedance adjustment circuit 220 for description. As shown in FIG. 5, the harmonic impedance adjustment circuit 500 comprise capacitors 510, 520, 540, 550 and inductors 530 and 560, wherein the capacitor 510 is coupled/embedded between the node N1 and a node N6, the capacitor 520 is coupled/embedded between the node N2 and the node N6, the inductor 530 is coupled between the node N6 and the ground voltage, the capacitor 540 is coupled/embedded between the node N1 and a node N7, the capacitor 550 is coupled/embedded between the node N2 and the node N7, and the inductor 560 is coupled/embedded between the node N7 and the ground voltage. In this embodiment, the harmonic impedance adjustment circuit 400 comprises an odd mode and an even mode, wherein the odd mode corresponds to the main components (differential signals) of the mixed signals V_I and V_Q, and the even mode corresponds to the even-order harmonic components of the mixed signals V_I and V_Q. Specifically, assuming that the capacitance of the capacitors 510, 520, 540 and 550 are all C1, the inductance of the inductor 530 is L1, and the inductance of the inductor 560 is L2, for the main components (differential signals) of the mixed signals V_I and V_Q in the odd mode, the harmonic impedance adjustment circuit 500 can be regarded as a capacitor with the capacitance C1 coupled/embedded between the nodes N1 and N2; and for the harmonic components of each of the mixed signals V_I and V_Q in the even mode, the harmonic impedance adjustment circuit 500 can be regarded as two sets of capacitor and inductor connected in series (one is a capacitor with the capacitance C1 and an inductor with the inductance 2*L1 connected in series, and the other one is a capacitor with the capacitance C1 and an inductor with the inductance 2*L2 connected in series). In this embodiment, since the capacitance of the capacitors 510, 520, 540 and 550 involve the main components of the mixed signals V_I and V_Q and are not suitable for arbitrary changes, the designer can mainly design the inductance L1 of the inductor 530 and the inductance L2 of the inductor 540 to make the impedance corresponding to its oscillation frequency is greatly reduced, so as to achieve the purpose of reducing specific harmonic components. Specifically, assuming that the designer knows that the harmonic components with frequency $(2*f_{LO}-2*f_{BB})$ and frequency $(3*f_{LO}-f_{BB})$ will affect the image rejection effect, the inductance L1 of the inductor 530 can be designed to reduce harmonic component with frequency $(2*f_{LO}-2*f_{BB})$, and the inductance L2 of the inductor 560 can be designed to reduce harmonic component with frequency $(3*f_{LO}-f_{BB})$.

In the embodiment of FIG. 2, the step of reducing harmonic components is performed by using the harmonic impedance adjustment circuit 220 coupled between the terminals N1 and N2, and the harmonic impedance adjustment circuit 250 coupled between the terminals N3 and N4; and the two output paths of the mixer 210 do not have harmonic filters to avoid affecting the main components of the mixed signals V_I and V_Q.

It should be noted that the transmitter 200 shown in FIG. 2 is only an example for illustration, and is not a limitation of the present invention. In other embodiments of the present invention, the number/position of the transformers may be changed, or the harmonic impedance adjustment circuit 250 may be removed from the transmitter 200.

Briefly summarized, in the transmitter of the present invention, by setting a harmonic impedance adjustment circuit to reduce the strength of specific harmonic components, the problem of image signals generated by these harmonic signals due to harmonic mixing can be effectively improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A transmitter, comprising:
   a mixer, configured to mix a first baseband signal with a first oscillation signal to generate a first mixed signal to a first node, and to mix a second baseband signal with a second oscillation signal to generate a second mixed signal to a second node;
   a first harmonic impedance adjustment circuit, coupled between the first node and the second node, configured to reduce harmonic components of the first mixed signal and the second mixed signal to generate an adjusted first mixed signal and an adjusted second mixed signal, respectively; and
   an amplifier, coupled to the first harmonic impedance adjustment circuit, configured to generate an amplified signal according to the adjusted first mixed signal and the adjusted second mixed signal.

2. The transmitter of claim 1, wherein the first harmonic impedance adjustment circuit comprises:
   a first capacitor, coupled between the first node and a ground voltage; and
   a second capacitor, coupled between the second node and the ground voltage.

3. The transmitter of claim 1, wherein the first harmonic impedance adjustment circuit comprises:
   a first capacitor, coupled between the first node and a specific node;
   a second capacitor, coupled between the second node and the specific node; and
   an inductor, coupled between the specific node and a ground voltage.

4. The transmitter of claim 3, wherein the first harmonic impedance adjustment circuit is configured to reduce harmonic components of the first mixed signal and the second mixed signal, wherein the harmonic components having twice the frequency of the first/second oscillation signal.

5. The transmitter of claim 1, wherein the first harmonic impedance adjustment circuit comprises:

a first capacitor, coupled between the first node and a specific node;
a second capacitor, coupled between the second node and the specific node;
a first inductor, coupled between the specific node and a ground voltage;
a third capacitor, coupled between the first node and another specific node;
a fourth capacitor, couple between the second node and the another specific node; and
a second inductor, coupled between the another specific node and the ground voltage.

6. The transmitter of claim 5, wherein the first capacitor, the second capacitor and the first inductor are configured to reduce harmonic components with a first frequency in the first mixed signal and the second mixed signal, and the third capacitor, the fourth capacitor and the second inductor are configured to reduce harmonic components with a second frequency in the first mixed signal and the second mixed signal.

7. The transmitter of claim 6, wherein the first frequency is twice the frequency of the first/second oscillation signal.

8. The transmitter of claim 7, wherein the second frequency is three times or four times the frequency of the first/second oscillation signal.

9. The transmitter of claim 6, wherein the second frequency is three times or four times the frequency of the first/second oscillation signal.

10. The transmitter of claim 1, wherein the amplifier generates a first amplified signal and a second amplified signal to a third node and a fourth node according to the adjusted first mixed signal and the adjusted second mixed signal, respectively, and the transmitter further comprises:

a second harmonic adjustment circuit, coupled between the third node and the fourth node, configured to reduce harmonic components of the first amplified signal and the second amplified signal.

11. The transmitter of claim 10, wherein the second harmonic impedance adjustment circuit comprises:
a first capacitor, coupled between the first node and a ground voltage; and
a second capacitor, coupled between the second node and the ground voltage.

12. The transmitter of claim 10, wherein the second harmonic impedance adjustment circuit comprises:
a first capacitor, coupled between the first node and a specific node;
a second capacitor, coupled between the second node and the specific node; and
an inductor, coupled between the specific node and a ground voltage.

13. The transmitter of claim 10, wherein the second harmonic impedance adjustment circuit comprises:
a first capacitor, coupled between the first node and a specific node;
a second capacitor, coupled between the second node and the specific node;
a first inductor, coupled between the specific node and a ground voltage;
a third capacitor, coupled between the first node and another specific node;
a fourth capacitor, couple between the second node and the another specific node; and
a second inductor, coupled between the another specific node and the ground voltage.

* * * * *